United States Patent [19]

Matsuno et al.

[11] Patent Number: 5,371,389
[45] Date of Patent: Dec. 6, 1994

[54] HETEROJUNCTION BIPOLAR TRANSISTOR WITH BASE LAYER HAVING GRADED BANDGAP

[75] Inventors: Toshinobu Matsuno, Osaka; Atsushi Nakagawa, Hyogo; Takashi Hirose; Kaoru Inoue, both of Osaka, all of Japan

[73] Assignee: Matsushita Electric Industrial Co., Ltd., Kadoma, Japan

[21] Appl. No.: 101,685

[22] Filed: Aug. 4, 1993

[30] Foreign Application Priority Data

Aug. 17, 1992 [JP] Japan .................. 4-217641

[51] Int. Cl.$^5$ .................. H01L 29/161; H01L 29/205; H01L 29/225
[52] U.S. Cl. .................. 257/197; 257/198; 257/592
[58] Field of Search .................. 257/198, 592, 197, 183

[56] References Cited

U.S. PATENT DOCUMENTS 4,482,910  11/1984  Nishizawa et al. .................. 257/592

FOREIGN PATENT DOCUMENTS 61-1051  1/1986  Japan .
63-81977  4/1988  Japan .
4-096334  3/1992  Japan .................. 257/198

OTHER PUBLICATIONS

O. Nakajima et al., "Supression of Emitter Size Effect on Current Gain in AlGaAs/GaAs HBTs", Japan J. Applied Phys., vol. 24, No. 10, pp. 1368–1369 (1985).

S. Nozaki et al., "GaAs Pseudo–Heterojunction Bipolar Transistor With a Heavily Carbon–Doped Base", Extended Abstracts of the 1991 International Conference on Solid State Devices and Materials, pp.356–358.

*Primary Examiner*—William D. Larkins
*Assistant Examiner*—John F. Guay
*Attorney, Agent, or Firm*—Willian Brinks Hofer Gilson & Lione

[57] ABSTRACT

A base layer interposed between an n-type GaAs collector layer and an n-type AlGaAs emitter layer is composed of a p-type InAlGaAs. From a collector/base interface to an emitter/base interface, an InAs composition of the base layer is decreased and a concentration of carbon as a p-type impurity thereof is increased so as to obtain a built-in internal field intensity in the base layer by a cooperative effect of the graded-bandgap and the impurity concentration gradient, thus reducing a base transit time of electrons. The base layer is fabricated according to MOMBE using TMG as a gallium source, controlling the InAs composition, so that a desired carbon concentration gradient is automatically formed. Thereby, a high performance heterojunction bipolar transistor with an increased built-in internal field intensity in the base layer is obtained.

1 Claim, 7 Drawing Sheets

HETEROJUNCTION BIPOLAR TRANSISTOR WITH BASE LAYER HAVING GRADED BANDGAP

BACKGROUND OF THE INVENTION

This invention relates to a heterojunction bipolar transistor and a method of manufacturing the transistor.

Recently, an interest has been shown in heterojunction bipolar transistors (hereinafter referred to it as HBTs) for application to a power amplifier, a digital IC and the like as a ultra-high-speed, super high-frequency device. According to "Suppression of Emitter Size Effect on Current Gain in AlGaAs/GaAs HBTs" by O. Nakajima et al., Jpn.J.Appl.Phys., Vol.24, No.10, 1985, pp. 1368–1369, it is known that an AlGaAs/GaAs HBT, having a graded-bandgap base construction, has high current gain, compared with an HBT having a uniform bandgap base construction.

Figure 6:
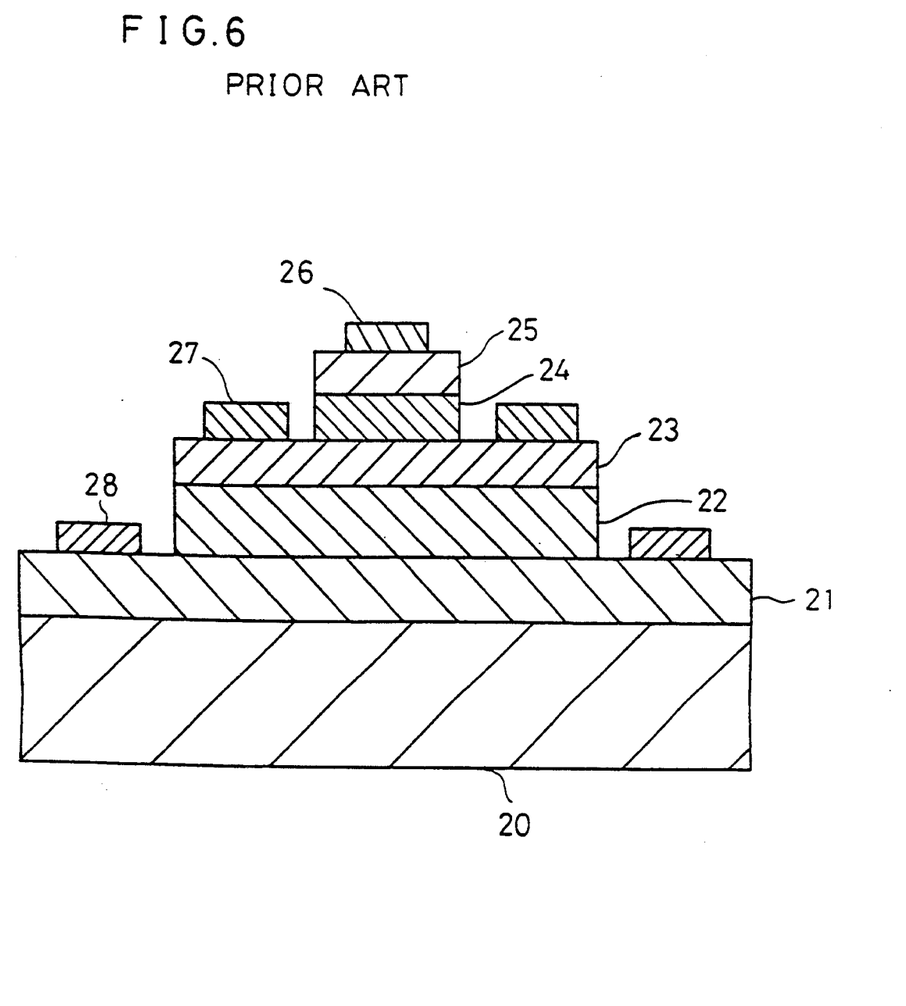
FIG. 6 is a section showing a construction of a heterojunction bipolar transistor having a conventional graded-bandgap base construction.

FIG. 6 is a section showing a construction of a simple mesa npn HBT having a conventional graded-bandgap base construction according to O. NakaJima et al. In the figure, the reference numeral 20 indicates a semi-insulating GaAs substrate, 21 indicates an n+-GaAs collector contact layer (sub-collector layer), 22 indicates an n-GaAs collector layer, 23 indicates a compositional grading p+-AlGaAs base layer, 24 indicates an n-AlGaAs emitter layer, 25 indicates an n+-GaAs emitter cap layer, 26 indicates an emitter electrode, 27 indicates a base electrode, and 28 indicates a collector electrode.

A fundamental operation of the HBT with the above construction is briefly explained. A part of the electrons injected from the emitter layer 24 to the base layer 23 are recombined with the holes in the base layer 23 as a base current, and the other part of the electrons reach the collector layer 22 as a collector current. The transistor is operated by changing the collector current by controlling the base current. Since the emitter layer 24 is composed of AlGaAs, which has a large bandgap, a reverse injection of holes from the base layer 23 to the emitter layer 24 is prevented, which results in a high emitter injection efficiency and a large current gain. The high current gain is maintained even with the base layer 23 whose concentration of p-type impurity is high, which leads to a lower base resistance. Further, since the material of the collector layer 22 and the like is GaAs, which is excellent in electron transfer characteristics, a high-speed operation such as a reduced collector transit time is contemplated. Since a threshold value almost depends on a difference of bandgap between the base and the emitter, its stability is ensured, compared with an FET. With high transconductance and comparatively small characteristic deviation due to micro-fabrication, it is useful for integration.

Figure 7:
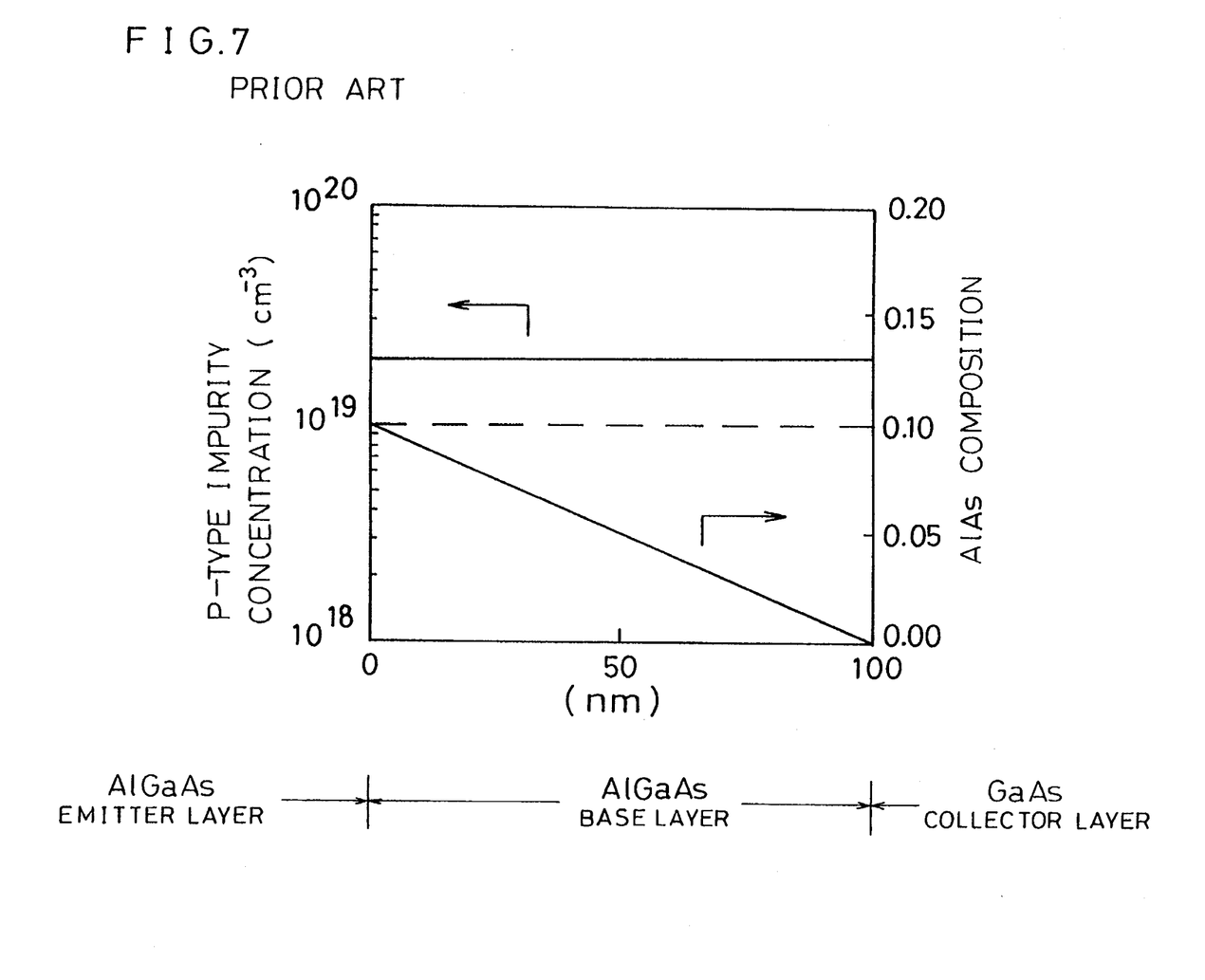
FIG. 7 s a view showing an AlGaAs base layer in FIG. 6.

Moreover, the HBT in FIG. 6 has the graded-bandgap base by giving a compositional grading to the base layer 23. The compositional grading of the AlGaAs base layer 23 is shown in FIG. 7. As is seen from FIG. 7, in the HBT, a composition of AlAs of the base layer 23 is continuously increased from an interface of the base layer 23 with the collector layer 22, to an interface thereof with the emitter layer 24, so as to continuously increase the bandgap of AlGaAs composing the base layer 23 from the collector/base interface to the emitter/base interface. In detail, the AlGaAs base layer 23 has 100 nm thickness and 0 AlAs composition (i.e. GaAs) at the collector/base interface and 0.1 AlAs composition (i.e. $Al_{0.1}Ga_{0.9}As$) at the emitter/base interface. With the graded-bandgap base construction, a built-in internal field whose intensity is about 12 kV/cm is caused in the base layer 23. The built-in internal field accelerates electrons so as to enhance the electron speed in the base layer 23, thus, improving the current gain, compared with the HBT with uniformed bandgap base construction. Wherein, as shown in FIG. 7, a concentration of a p-type impurity in the base layer 23 is uniform.

The built-in internal field intensity of the GaAs/AlGaAs HBT, with the graded-bandgap base construction, can be increased up to about 20–30 kV/cm at which intensity, transition is caused between the $\pi$ and L valleys. However, it is hard to further increase the built-in internal field intensity in the base layer 23 when AlGaAs is used as the material of the base layer 23. When the AlAs composition at the emitter/base interface is increased more than 0.2 in order to increase the grading of the bandgap of the AlGaAs base layer 23, an energy barrier of valence band between the emitter and base layers is decreased. As a result, it is apt to cause the reverse injection of holes from the base layer 23 to the emitter layer 24, and decrease the emitter injection efficiency. Consequently, the AlAs composition in the base layer 23 on the emitter side should not exceed 0.2. Therefore, the increase of the built-in internal field intensity in the AlGaAs base layer 23 with the graded-bandgap base construction is restricted.

In addition, compared with an HBT with a GaAs base layer, the AlGaAs base layer 23 has a higher base resistance to cause degradation of high-frequency characteristics. Beryllium (Be) is typically used as a p-type impurity in the AlGaAs base layer 23. With heavy doping for decreasing the base resistance, problems of variation per hour of collector current at high-current-density operation due to diffusion of Be, current gain decrease due to surface recombination and the like arise. It is also known that segregation of Be is liable to be caused in AlGaAs.

SUMMARY OF THE INVENTION

The object of the present invention is to provide a high performance HBT by increasing a built-in internal field intensity in the base layer.

To attain the above object in the present invention in an HBT with a graded-bandgap base construction, a gradient of impurity concentration is provided in the base layer.

In detail, a bandgap of the material composing the base layer is continuously increased from the collector/base interface to the emitter/base interface, and the concentration of impurity in the base layer is continuously increased from the collector/base interface to the emitter/base interface. Accordingly, the impurity concentration gradient in the base layer contributes to an increase of the built-in internal field intensity in the base layer due to the graded-bandgap, which is increased from the collector/base interface to the emitter/base interface. In other words, since the impurity concentration in the base layer is continuously increased from the collector/base interface to the emitter/base interface, the built-in internal field in a direction accelerating electrons from the emitter layer toward the collector layer is further generated. With a cooperative effect of the two built-in internal fields, electrons injected from the emitter layer to the base layer are accelerated, thus reducing a base transit time. Since a drift current component in a base current becomes large, a recombination current component around the base layer, which causes a decrease of current gain is relatively reduced.

In order to efficiently manufacture an HBT with the graded-bandgap base construction having the above impurity concentration gradient, a metalorganic molecular beam epitaxy (hereinafter referred to it as MOMBE) is applied so as to dope carbon generated from the organic metal as a p-type impurity to the base layer for fabricating the base layer composed of a mixed crystal including at least InAs. Further, the InAs composition of the base layer is continuously decreased from the collector/base interface to the emitter/base interface so as to continuously increase the bandgap of the mixed crystal including InAs composing the base layer from the collector/base interface to the emitter/base interface, and so as to automatically, continuously increase the carbon concentration in the base layer from the collector/base interface to the emitter/base interface. By changing the InAs composition of InAlGaAs, a desired concentration gradient of the p-type impurity (carbon) is automatically formed at the same time with the fabrication of the InAlGaAs layer.

PREFERRED EMBODIMENTS OF THE PRESENT INVENTION

Two HBTs according to preferred embodiments of the present invention are described, with reference to the accompanying drawings.

(FIRST EMBODIMENT)

Figure 1:
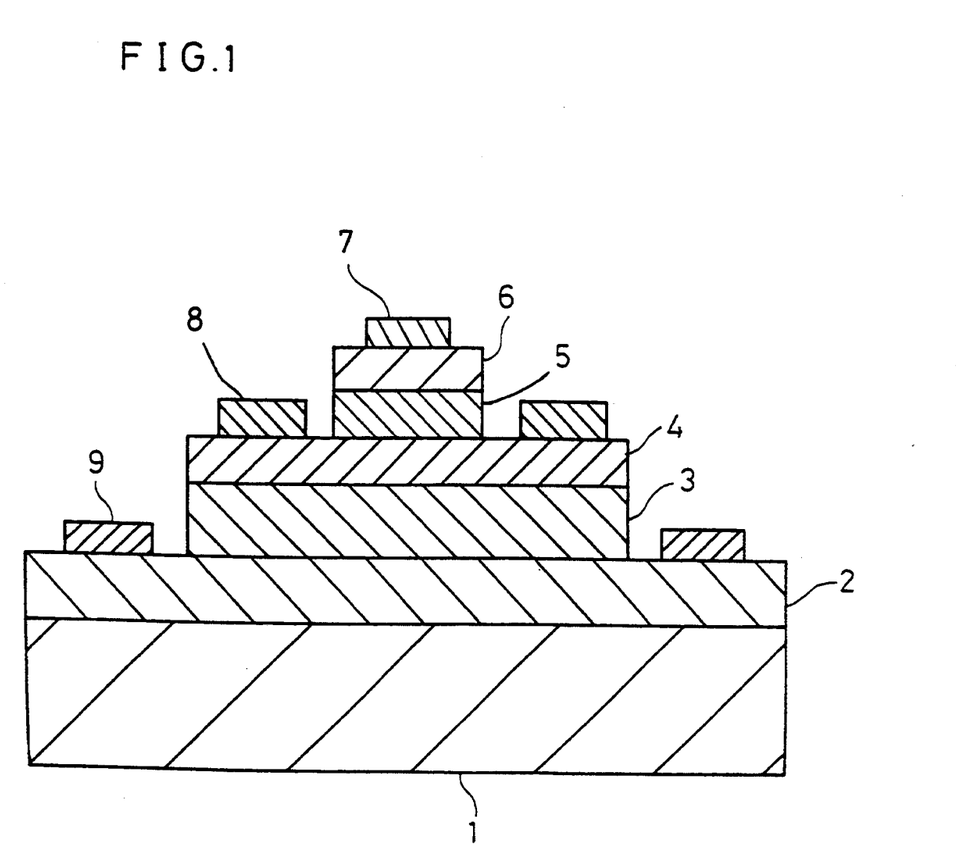
FIG. 1 is a section showing a construction of a heterojunction bipolar transistor according to a first embodiment of the present invention.

FIG. 1 shows a sectional construction of an npn HBT according to the first embodiment of the present invention. In the figure, reference numeral 1 indicates a semi-insulating GaAs substrate, 2 indicates an n+-GaAs collector contact layer, 3 indicates an n-GaAs collector layer, 4 indicates a compositional grading p+-InAlGaAs base layer, 5 indicates an n-AlGaAs emitter layer, 6 indicates an n+-GaAs emitter cap layer, 7 indicates an emitter electrode, 8 indicates a base electrode, and 9 indicates a collector electrode.

The n+-GaAs collector contact layer 2 as a sub-collector layer, the n-GaAs collector layer 3, the n-AlGaAs emitter layer 5 and the n+-GaAs emitter cap layer 6, which are n-type layers, have respective thicknesses of 500 nm, 400 nm, 100 nm and 100 nm, and the respective doped amounts of Si as an n-type impurity are $5 \times 10^{18}$ cm$^{-3}$, $5 \times 10^{16}$ cm$^{-3}$, $5 \times 10^{16}$ cm$^{-3}$, and $5 \times 10^{18}$ cm$^{-3}$. An AlAs composition of the n-AlGaAs emitter layer 5 is 0.3.

Figure 2:
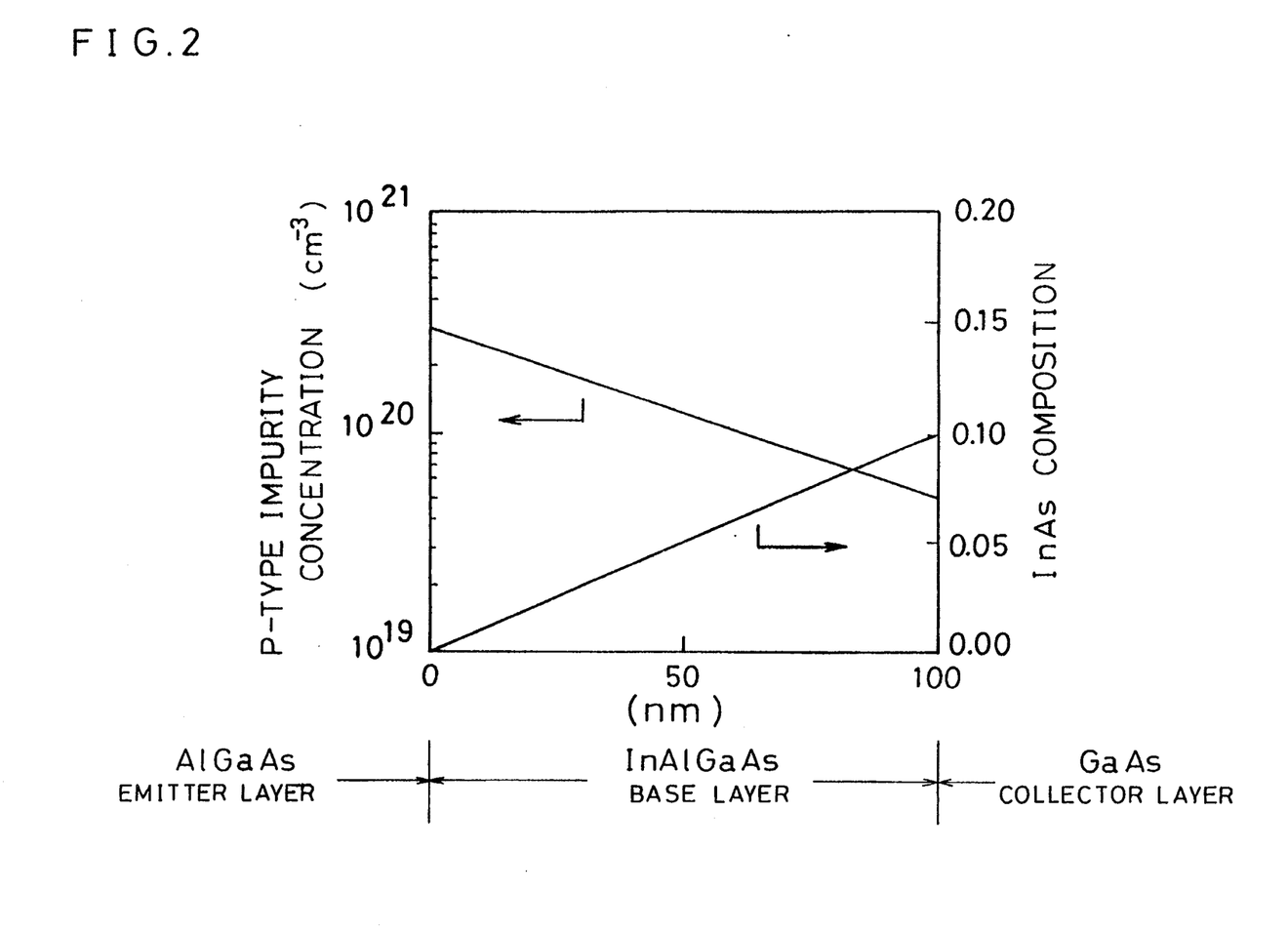
FIG. 2 is an explanatory drawing of an InAlGaAs base layer in FIG. 1.

FIG. 2 shows a compositional grading of InAs and a concentration gradient of a p-type impurity in the p+-InAlGaAs base layer 4. The base layer 4 is composed of $In_x(Al_yGa_{1-y})_{1-x}As$ ($0 \leq x < 1$, $0 \leq y < 1$) and has a 100 nm thickness. Wherein, as can be seen from FIG. 2, an InAs composition x is almost linearly decreased from 0.1 at an interface of the base layer 4 with the collector layer 3 to 0 at an interface of the base layer 4 with the emitter layer 5 so as to continuously increase a bandgap of the base layer 4 from an interface thereof with the n-GaAs collector layer 3 to an interface thereof with the n-AlGaAs emitter layer 5. On the other hand, though not shown, an Al composition y is continuously increased from 0 at the collector/base interface to 0.1 at the emitter/base interface so as to fortify the bandgap grading of the base layer 4 by the compositional grading of InAs. In detail, the material of the base layer 4 is $In_{0.1}Ga_{0.9}As$ at the collector/base interface and $Al_{0.1}Ga_{0.9}As$ at the emitter/base interface. The concentration of carbon as the p-type impurity in the base layer 4 is increased almost linearly from $5 \times 10^{19}$ cm$^{-3}$ at the collector/base interface to $3 \times 10^{20}$ cm$^{-3}$ at the emitter/base interface.

According to the HBT with the above construction in this embodiment, since both compositions x, y of $In_x(Al_yGa_{1-y})_{1-x}As$, which compose the base layer 4, have the grading for contemplating the graded-bandgap base construction, a built-in internal field intensity of the base layer 4 due to the graded-bandgap is made large. By setting the upper limit of the Al composition y to 0.1, lowering of an energy barrier of valence band between the $Al_{0.1}Ga_{0.9}As$ at the emitter/base interface and the AlGaAS composing the emitter layer 5 is prevented. In addition, an electric field, in the same direction generated in accordance with the concentration gradient of the p-type impurity, is added to the built-in internal field of the base layer 4 due to graded-bandgap. As a result, electrons injected from the emitter layer 5 to the base layer 4 are accelerated by the large built-in internal field of the base layer 4, thus reducing the base transit time. With the base layer 4 composed of InAlGaAs, the base resistance is towered, compared with the case with AlGaAs.

It is necessary to set the thickness of the InAlGaAs base layer 4 to not exceed a critical thickness to prevent dislocation and defect due to mismatch of lattice. The critical thickness depends on the InAs composition x. According to a model in "Calculation of critical layer thickness versus lattice mismatch for $Ge_xSI_{-x}/SI$" by R. People and J. C. Bean, Appl. Phys. Lett. 47(3), Aug. 1, 1985, pp. 322-324 and Appl. Phys. Lett. 49(4), Jul. 28, 1986, p. 229, the critical thickness of InGaAs layer is about 260 nm in case with 0.1 InAs composition and about 48 nm in case with 0.2 InAs composition. Since the critical film thickness in view of electric characteristics of an electronic device approximates the model, the upper limit of the InAs composition x of the InAlGaAs base layer 4, i.e. a value at the collector/base interface preferably does not exceed 0.3. In this embodiment, no problem might be involved when the thickness of the base layer 4 is set to not exceed 100 nm, because the InAlGaAs base layer 4 is composed of $In_{0.1}Ga_{0.9}As$ at the collector/base interface. The Al composition y of the InAlGaAs base layer 4 may be constant.

According to this embodiment, as described above, since the concentration gradient of the p-type impurity supplements the built-in internal field intensity in the base layer 4, a large built-in internal field intensity is obtained in the base layer 4 even if the thickness of the InAlGaAs base layer 4 is lessened and the Al composition is lessened. In other words, the electric field can be applied to the base layer 4 without lowering the emitter injection efficiency, and the device construction is freely arranged. Also, when the compositional grading of $In_x(Al_yGa_{1-y})_{1-x}As$ ($0 \leq x < 1$, $0 \leq y < 1$), which is a material composing the base layer 4, is varied from $In_xGa_{1-x}As$ (y=0) to $Al_yGa_{1-y}As$ (x=0), a further large built-in internal field intensity can be obtained.

Figure 5:
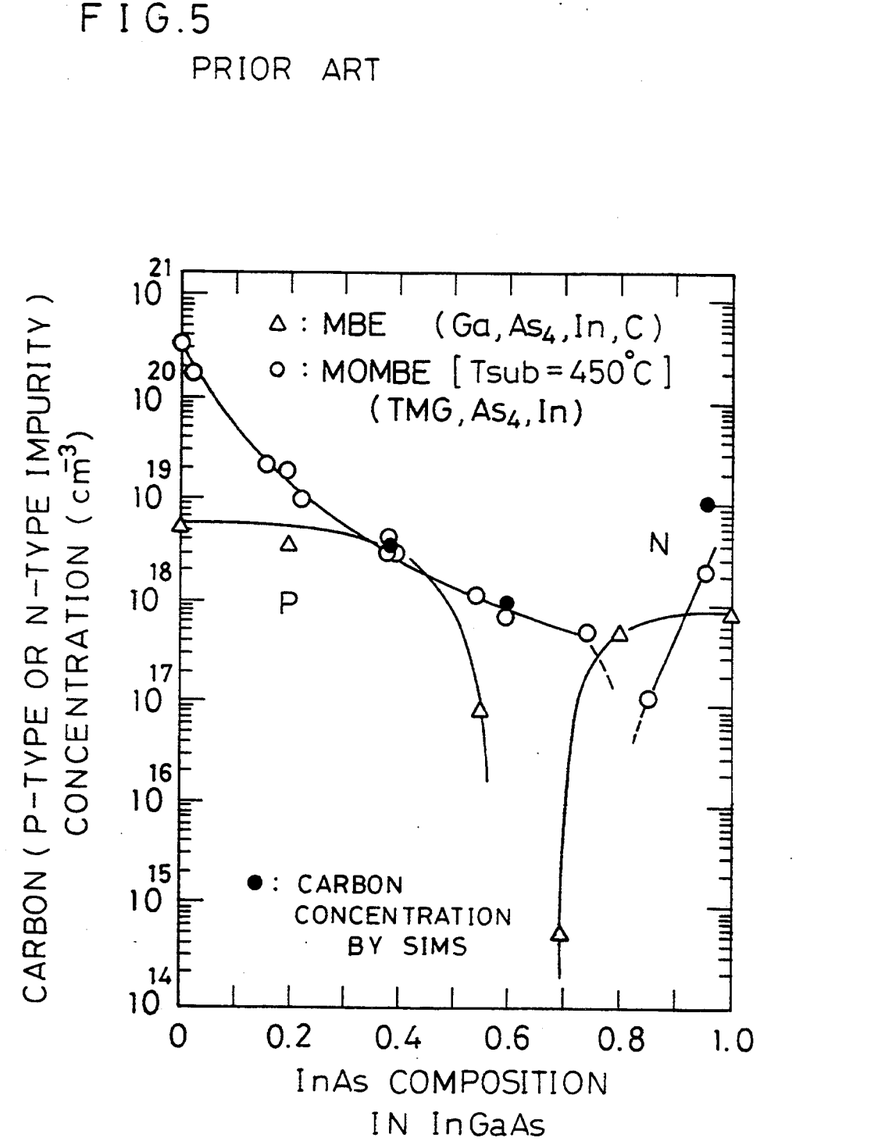
FIG. 5 is a view showing a known carbon-doping characteristic in InGaAs according to the MOMBE.

FIG. 5 shows a known carbon-doping characteristic in InGaAs according to the MOMBE (S. Nozaki et al., "GaAs Pseudo-Heterojunction Bipolar Transistor with a Heavily Carbon-Doped Base", Extended Abstracts of the 1991 International Conference on SSDM, 1991, pp. 356–358). FIG. 5 illustrates that when the MOMBE is applied so as to dope InGaAs with carbon generated from trimethylgalllum $Ga(CH_3)_3$, which is one of the organic metals, the carbon doping amount depends on the InAs composition. At this time, when the InAs composition is set to not exceed 0.6, the doped carbon serves as an acceptor. Further, when the InAs composition is decreased within a range not exceeding 0.6, the concentration of the doped carbon as the p-type impurity is increased.

Hence, in the case where the carbon is used as the p-type impurity to be doped to the base layer 4, a following preferable method for manufacturing a heterojunction bipolar transistor can be employed. Namely, when the MOMBE is applied for fabricating the InAlGaAs base layer 4 in this embodiment so as to dope the carbon generated from TMG as a gallium source, the carbon concentration of the base layer 4 is automatically varied from $5 \times 10^{19}$ cm$^{-3}$ to $3 \times 10^{20}$ cm$^{-3}$ by changing the InAs composition of the base layer 4, accompanied by an increase of thickness of the base layer 4. The carbon concentration suffices as a carrier concentration of the base layer 4. Thereby, the HBT with the graded-bandgap base construction, having a desired impurity concentration gradient, can be efficiently manufactured. About 450° C. is suitable for the temperature of the substrate.

Beryllium can be doped to the base layer 4 as the p-type impurity, instead of carbon.

(SECOND EMBODIMENT)

Figure 3:
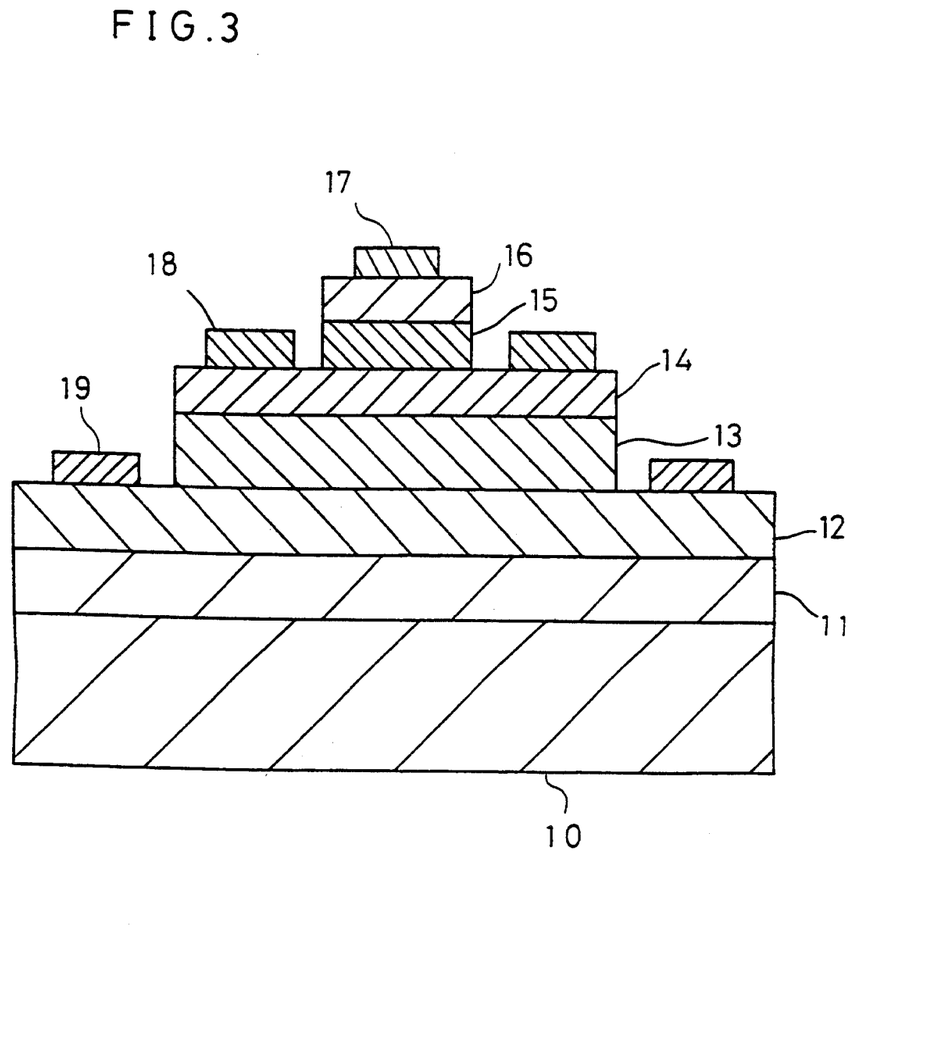
FIG. 3 is a section showing a construction of a heretojunction bipolar transistor according to a second embodiment of the present invention.

FIG. 3 shows a sectional construction of an npn HBT according to the second embodiment of the present invention. In FIG. 3, reference numeral 10 indicates a semi-insulating InP substrate, 11 indicates an InAlAs buffer layer, 12 indicates an n+-InGaAs collector contact layer, 13 indicates an n-InGaAs collector layer, 14 indicates a compositional grading p+-InAlGaAs base layer, 15 indicates an n-InAlAs emitter layer, 16 indicates an n+-InGaAs emitter cap layer, 17 indicates an emitter electrode, 18 indicates a base electrode, and 19 indicates a collector electrode.

The InAlAs buffer layer 11 is non-doped and has a 300 nm thickness. The n+-InGaAs collector contact layer 12 as a subcollector layer has a 500 nm thickness and the doping amount thereof is $1 \times 10^{19}$ cm$^{-3}$. The n-InGaAs collector layer 13 is undoped and a 500 nm thickness. The n-InAlAs emitter layer 15 a 100 nm thickness and the doping amount thereof is $2 \times 10^{17}$ cm$^{-3}$. The n+-InGaAs emitter cap layer 16 has a 100 nm thickness and the doping amount thereof is $2 \times 10^{19}$ cm$^{-3}$. Wherein, the InAs compositions of the InAlAs layers 11, 15 and the InGaAs layers 12, 13, 16 are set to be about 0.53 so as to lattice-match with the InP substrate 10.

Figure 4:
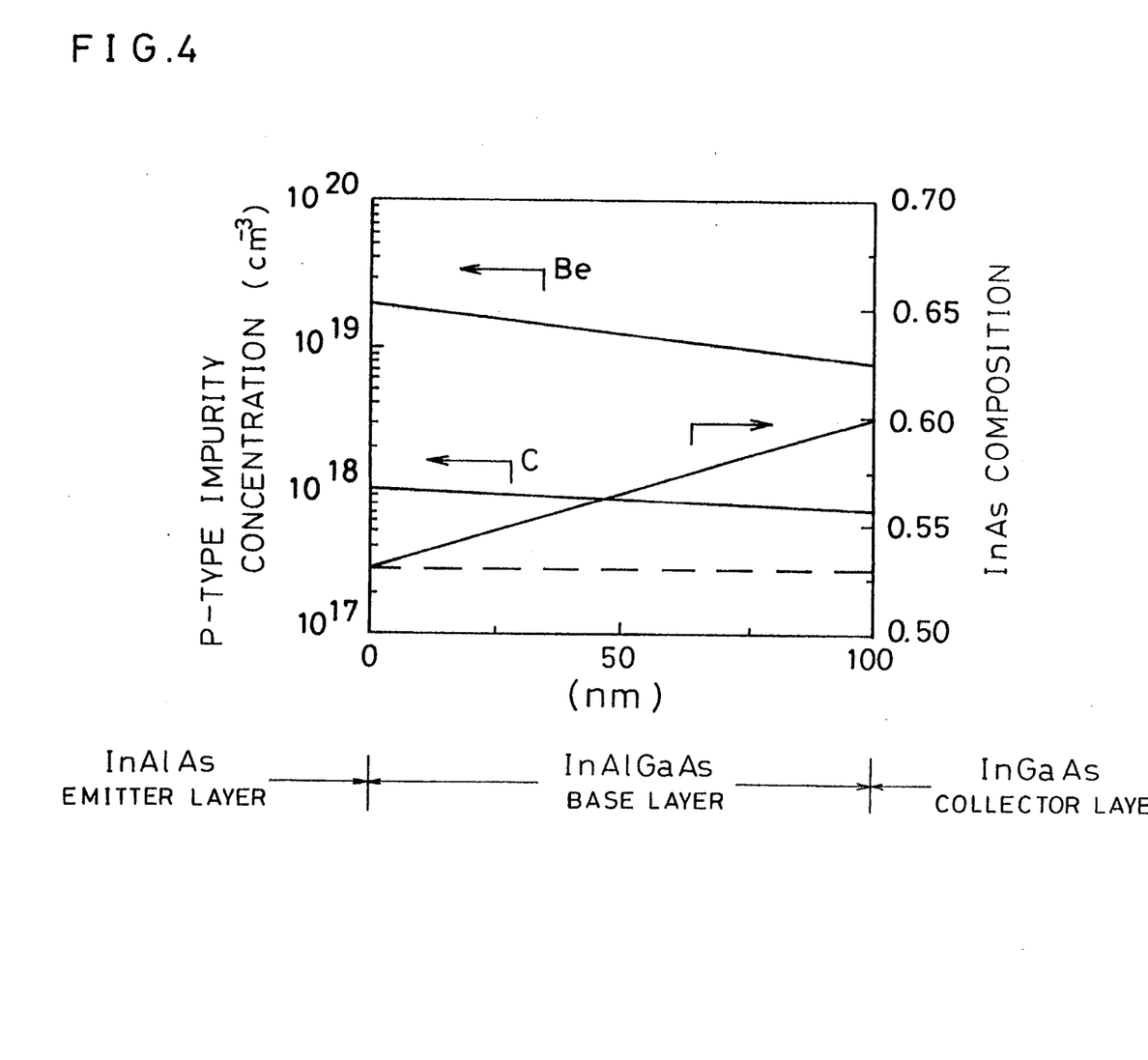
FIG. 4 is an explanatory drawing of an InAlGaAs base layer in FIG. 3.

FIG. 4 shows the compositional grading of InAs and the concentration gradient of the p-type impurity in the p+-InAlGaAs base layer 14. Taking account of the critical thickness, the base layer 14 is composed of $In_x(Al_yGa_{1-y})_{1-x}As$ ($0 \leq x < 1$, $0 \leq y < 1$) of 100 nm thickness. Wherein, the InAs composition x as shown in FIG. 4 is almost linearly decreased from 0.60 at the collector/base interface to 0.53 at the emitter/base interface, so as to continuously increase the bandgap of the base layer 14 From the interface of the base layer 14 with the n-InGaAs collector layer 13 to the interface thereof with the n-InAlAs emitter layer 15. The Al composition y is so set that the energy barrier of valence band is large enough at the emitter/base interface. In addition, the concentration of carbon, as a first p-type impurity in the base layer 14, is continuously increased from the collector/base interface to the emitter/base interface according to the application of the MOMBE, so as to be about $1 \times 10^{18}$ cm$^{-3}$ at the emitter/base interface. As shown in FIG. 5, the InAs composition in InGaAs is set to be about 0.53, considering the lattice match with the InP substrate 10, with a result that the carbon as a dopant is hard to enter into InGaAs. Beryllium is doped as a second p-type impurity as shown in FIG. 4, for supplementing the concentration of the p-type impurity of the base layer 14 more than $1 \times 10^{18}$ cm$^{-3}$. The Be concentration in the base layer 14 is increased almost linearly from $1 \times 10^{19}$ cm$^{-3}$ at the collector/base interface to $2 \times 10^{19}$ cm$^{-3}$ at the emitter/base interface. By simultaneous doping of carbon and Be, the carbon concentration gradient is enhanced.

According to the HBT with the above construction in this embodiment, the p-type impurity concentration necessary for the HBT base layer 14 is obtained by doping both carbon and Be, and a large built-in internal field intensity in a direction accelerating electrons from the emitter toward the collector is obtained in the base layer 14 by the cooperative effect of the graded-bandgap and the p-type impurity concentration gradient of the base layer 14. In addition, since Be is doped together with carbon as the p-type impurity, the base resistance is decreased even in the case where carbon is hard to enter into the InAlGaAs base layer 14. The Be concentration in the base layer 14 may be uniform only when the Be concentration exceeds $1 \times 10^{19}$ cm$^{-3}$.

We claim:
1. A heterojunction bipolar transistor comprising:
   a semi-insulating substrate composed of InP;
   a collector layer and an emitter layer provided on said semi-insulating substrate; and
   a base layer provided on said semi-insulating substrate and interposed between said collector layer and said emitter layer,
   said base layer composed of $In_x(Al_yGa_{1-y})_{1-x}As$ ($0 \leq x < 1$, $0 \leq y < 1$) including carbon and beryllium as p-type impurities of said base layer and having a compositional grading of InAs, and
   wherein said composition of InAs in said base layer is continuously decreased from the interface thereof with said collector layer to the interface thereof with said emitter layer so as to continuously increase the bandgap of the material composing said base layer from the interface thereof with said collector layer to the interface thereof with said emitter layer, and
   wherein the impurity concentration in said base layer is continuously increased from the interface thereof with said collector layer to the interface thereof with said emitter layer.

* * * * *